(12) United States Patent
Lee

(10) Patent No.: US 7,358,552 B2
(45) Date of Patent: Apr. 15, 2008

(54) COMPLEMENTARY METAL-OXIDE-SEMICONDUCTOR IMAGE SENSOR AND METHOD FOR FABRICATING THE SAME

(75) Inventor: Ju-Il Lee, Chungcheongbuk-do (KR)

(73) Assignee: Magnachip Semiconductor, Ltd., Chungcheongbuk-do (KR)

( * ) Notice: Subject to any disclaimer, the term of this patent is extended or adjusted under 35 U.S.C. 154(b) by 12 days.

(21) Appl. No.: 11/236,047

(22) Filed: Sep. 26, 2005

(65) Prior Publication Data

US 2006/0192250 A1    Aug. 31, 2006

Related U.S. Application Data

(60) Provisional application No. 60/657,323, filed on Feb. 28, 2005.

(51) Int. Cl.
H01L 31/062    (2006.01)
(52) U.S. Cl. ........................ 257/292; 257/384
(58) Field of Classification Search ............... 257/258, 257/290–293, 335, 341, 384
See application file for complete search history.

(56) References Cited

U.S. PATENT DOCUMENTS

| | | | |
|---|---|---|---|
| 5,898,196 A * | 4/1999 | Hook et al. | 257/292 |
| 6,037,222 A * | 3/2000 | Huang et al. | 438/257 |
| 6,040,593 A * | 3/2000 | Park | 257/292 |
| 6,171,942 B1 * | 1/2001 | Lee et al. | 438/596 |
| 6,414,342 B1 * | 7/2002 | Rhodes | 257/291 |
| 6,570,222 B2 * | 5/2003 | Nozaki et al. | 257/347 |
| 2001/0025970 A1 * | 10/2001 | Nozaki et al. | 257/255 |
| 2002/0111002 A1 * | 8/2002 | Kim | 438/592 |
| 2003/0085400 A1 * | 5/2003 | He et al. | 257/59 |
| 2004/0046193 A1 * | 3/2004 | Park et al. | 257/292 |
| 2005/0104108 A1 * | 5/2005 | Hong | 257/298 |

FOREIGN PATENT DOCUMENTS

| | | |
|---|---|---|
| KR | 2001-93670 | 10/2001 |
| KR | 10-2005-0040353 | * 5/2005 |

OTHER PUBLICATIONS

Notice of Preliminary Rejection dated Sep. 27, 2005 of Korean Application No. 2003-75537, filed Feb. 28, 2005.

* cited by examiner

*Primary Examiner*—Mark Prenty
(74) *Attorney, Agent, or Firm*—Blakely Sokoloff Taylor & Zafman

(57) ABSTRACT

A complementary metal-oxide-semiconductor (CMOS) image sensor and a method for fabricating the same are provided. The CMOS image sensor includes: a pixel region provided with a plurality of unit pixels, each including a buried photodiode and a floating diffusion region; and a logic region provided with CMOS devices for processing data outputted from the unit pixels, wherein a self-aligned silicide layer is formed on gate electrodes and source/drain regions of the CMOS devices in the logic region while a self-aligned silicide blocking layer is formed over the pixel region.

2 Claims, 5 Drawing Sheets

COMPLEMENTARY METAL-OXIDE-SEMICONDUCTOR IMAGE SENSOR AND METHOD FOR FABRICATING THE SAME

This application relies for priority upon U.S. Provisional Patent Application No. 60/657,323 filed on Feb. 28, 2005, the contents of which are herein incorporated by reference in its entirety.

FIELD OF THE INVENTION

The present invention relates to a complementary metal-oxide-semiconductor (CMOS) image sensor and a method for fabricating the same; and, more particularly, to a CMOS image sensor for improving reproducibility of a process in deep submicron technology below 0.25 μm as well as for satisfying optical characteristics of a pixel region and electrical characteristics of a logic region.

DESCRIPTION OF RELATED ARTS

Generally, a complementary metal-oxide-semiconductor (CMOS) image sensor is a device that converts an optical image into an electric signal through employing CMOS technology. Especially, the CMOS image sensor takes a switching mode that sequentially detects outputs by using MOS transistors fabricated so that one CMOS image sensor corresponds to one pixel. The CMOS image sensor has several well-known advantages compared with a charge coupled device (CCD), which has been commonly used as an image sensor in current days. With CMOS technology, an easy operation mode and various scanning modes can be realized. Also, signal processing circuits can be integrated into a single chip, thereby realizing product minimization, and manufacturing costs can also be reduced because of the use of compatible CMOS technology. Furthermore, low power dissipation is another provided advantage when using a CMOS image sensor.

FIG. 1 is a circuit diagram showing a unit pixel of a typical CMOS image sensor.

Referring to FIG. 1, the unit pixel of the CMOS image sensor includes one buried photodiode (BPD) and four N-channel MOS (NMOS) transistors.

The four NMOS transistors include: a transfer transistor (Tx) for transferring photo-generated electric charges generated from the buried photodiode to a floating diffusion region, which serves as a sensing node; a reset transistor (Rx) for discharging the photo-generated electric charges stored into the floating diffusion region to detect a next signal; a drive transistor (MD) serving as a source follower buffer amplifier; and a select transistor (Sx) for selectively outputting an electric potential value corresponding to the photo-generated electric charge.

Herein, the transfer transistor Tx and the reset transistor Rx are configured with native NMOS transistors with an extremely low threshold voltage to prevent a decrease in charge transfer efficiency arising when charges/electrons are discharged as a voltage level abruptly descends by a positive threshold voltage value.

FIG. 2 is a cross-sectional view showing a typical CMOS image sensor. Especially, FIG. 2 shows transistors in a pixel region and transistors in a logic region for reading data from pixels.

As shown, a buried photodiode BPD has a PNP junction structure obtained as a p-type epi layer 202, a $P^0$-type impurity diffusion region 207 and an $N^-$-type impurity diffusion region 208 are stacked. Instead of applying an ion implantation process for adjusting transistor characteristics such as a threshold voltage characteristic and a punch-through characteristic to a portion of the p-type epi layer 202 serving as a channel beneath a gate electrode of a transfer transistor Tx, the transfer transistor Tx is configured in a native transistor, which is an NMOS transistor having an extremely low threshold voltage level, so that charge transfer efficiency can be maximized. Herein, this portion of the p-type epi layer 202 is denoted with a reference numeral 202A. Also, an $N^+$-type impurity diffusion region 209A formed beneath a surface of the p-type epi-layer 202 disposed between the transfer transistor Tx and a reset transistor Rx is solely the highly doped $N^+$-type impurity diffusion region without including a lightly doped drain (LDD) region, and the $N^+$-type impurity diffusion region 209A is a floating diffusion region serving as a sensing node. As a result of this specific configuration of the $N^+$-type impurity diffusion region 209A, it is possible to amplify a change in an electric potential of the floating diffusion region according to an amount of transferred charges.

Meanwhile, this conventional CMOS image sensor reads data by detecting an electric signal corresponding to a photo-generated electric charge through a correlated double sampling (CDS). To detect the electric signal rapidly and stably, such a CMOS image sensor compatible with high-speed operation is required. Therefore, to improve the operation speed of a transistor of the conventional CMOS image sensor, a gate electrode 206 is formed in a polycide structure including a polysilicon layer 206A and a tungsten silicide layer 206B. This polycide structure is applied to transistors in a pixel region and a logic region.

Meanwhile, it is preferable to apply a self-aligned silicide process to form a silicide layer on source/drain regions in addition to the gate electrodes. However, in the conventional CMOS image sensor, the above mentioned typical self-aligned silicide process causes the silicide layer to be formed even on the $P^0$-type impurity diffusion region 207 of the buried photodiode (BPD), and this silicide layer formed on the $P^0$-type impurity diffusion region 207 blocks the buried photodiode BPD from detecting light.

Because of this critical defect, as shown in FIG. 2, the polycide gate structure in which the silicide layer is formed only on the gate electrode 206 of each transistor is employed. However, in a sub-0.25 μm CMOS image sensor, the usage of the polycide gate structure does not provide an intended level of the operation speed. That is, although the polycide gate structure is not a problem in 0.5 μm or 0.35 μm CMOS image sensor in regards of the operation speed, it is difficult to obtain an intended level of the operation speed with use of this polycide structure in the sub-0.25 μm or 0.18 μm CMOS image sensor.

Hence, in Korean Patent No. 291179 issued to Sang-Hoon Park on Mar. 8, 2001, entitled "Complementary Metal-Oxide-Semiconductor (CMOS) Image Sensor with Self-Aligned Silicide Layer and Method for Fabricating the Same," it is suggested to form a silicide layer on a gate and source/drain regions of a transistor while masking a photodiode region.

FIG. 3 is a cross-sectional view showing a pixel of a CMOS image sensor disclosed in Korean Patent No. 291179.

As shown, the pixel of the CMOS image sensor includes: a p-type epi layer 12 epitaxially grown on a substrate 11; a buried photodiode (BPD) for generating photo-electric charges by detecting external light, the buried photodiode BPD formed within the p-type epi layer 12; an $N^+$-type floating diffusion region 24A for storing the photo-electric charges generated by the buried photodiode BPD, the N⁺-type floating diffusion region 24A formed beneath a portion of a surface of the p-type epi layer 12; a gate of a transfer transistor Tx formed on a portion of the p-type epi layer 12 disposed between the N⁺-type floating diffusion region 24A and the buried photodiode BPD; an N⁺-type drain junction 24B formed beneath another portion of the surface of the p-type epi layer 12; a gate of a reset transistor Rx formed on a portion of the p-type epi layer 12 disposed between the N⁺-type floating diffusion region 24A and the N⁺-type drain junction 24B; a p-well 13; N⁺-type impurity diffusion regions 24C for use in source/drain regions formed beneath a surface of the p-well 13; a driver transistor MD having a gate (not shown) electrically connected with the N⁺-type floating diffusion region 24A; and a select transistor Sx including the N⁺-type impurity diffusion regions 24C. Except for the buried photodiode BPD, a silicide layer 25 is formed on the gate of the transfer transistor Tx, the gate of the reset transistor Rx, the N⁺-type floating diffusion region 24A, the N⁺-type drain junction 24B, the gates of the driver transistor MD and the select transistor Sx and the N⁺-type impurity diffusion regions 24C.

Also, an oxide pattern 21A based on a material of tetraethylorthosilicate (TEOS) is formed on the buried photodiode BPD to prevent formation of the self-aligned silicide layer. The oxide pattern 21A is formed simultaneously with spacers 21B which are formed on sidewalls of each gate. That is, the oxide pattern 21A and the spacers 21B are based on the same material.

In the above method disclosed in Korean Patent No. 291179, the self-aligned silicide layer is formed on the transistors in the pixel region and the logic region while the photodiode region is masked. However, according to this disclosed method, the silicide layer can be formed on a surface of the N⁺-type floating diffusion region 24A. Thus, leakage current increases at the N⁺-type floating diffusion region 24A.

Since the CMOS image sensor detects a change in an electric potential at the N⁺-type floating diffusion region in the pixel region and uses this detection as a data, the leakage current at the N⁺-type floating diffusion region becomes a cause for a critical error in the detection of electric signals. Especially, the leakage current also causes degradation in a dark characteristic, which produces a defect in that a display screen becomes whitened in a dark state. For this reason, the application of the silicide layer vulnerable to the leakage current to the floating diffusion region, which is a sensing node, may increase a probability of producing the above mentioned defect. Also, although there is one suggested method to block the self-aligned silicide layer at the edge of the gate of the transfer transistor as shown in FIG. 3, in a 0.18 μm transistor, the size is too small to achieve good process reproducibility. Furthermore, it may be difficult to form the self-aligned silicide layer uniformly on the gate if the self-aligned silicide layer formation is blocked at the edge of the gate.

SUMMARY OF THE INVENTION

It is, therefore, an object of the present invention to provide a complementary metal-oxide-semiconductor (CMOS) image sensor capable of obtaining intended levels of operation speed and photo-detection characteristic in a device applied with the design rule of a ultra fine line width and of suppressing an incidence of leakage current at a floating diffusion region serving as a sensing node in a pixel region.

In accordance with an aspect of the present invention, there is provided a complementary metal-oxide-semiconductor (CMOS) image sensor, including: a pixel region provided with a plurality of unit pixels, each including a buried photodiode and a floating diffusion region; and a logic region provided with CMOS devices for processing data outputted from the unit pixels, wherein a self-aligned silicide layer is formed on gate electrodes and source/drain regions of the CMOS devices in the logic region while a self-aligned silicide blocking layer is formed over the pixel region.

In accordance with another aspect of the present invention, there is provided a complementary metal-oxide-semiconductor (CMOS) image sensor, including: a pixel region provided with a plurality of unit pixels, each including a buried photodiode and a floating diffusion region are formed; and a logic region provided with CMOS devices for processing data outputted from the unit pixels, wherein a self-aligned silicide blocking layer is formed over a region extending from the buried photodiode to the floating diffusion region while a self-aligned silicide layer is formed on the devices in the pixel region except for the region where the self-aligned silicide blocking layer is formed and on gate electrodes and source/drain regions of the CMOS devices in the logic region.

In accordance with still another aspect of the present invention, there is provided a unit pixel of a complementary metal-oxide-semiconductor (CMOS) image sensor, including: a semi-conductor layer of a first conductive type; a buried photodiode formed in the semi-conductor layer; a floating diffusion region of a second conductive type formed beneath a portion of a surface of the semi-conductor layer and including a highly doped impurity region; a gate of a transfer transistor formed on the semi-conductor layer disposed between the floating diffusion region and the buried photodiode; a drain junction of the second conductive type formed beneath another portion of the surface of the semiconducive layer and including a highly doped impurity region; a gate of a reset transistor formed on the semiconductor layer disposed between the floating diffusion region and the drain junction; a well region of the first conductive type formed in a portion of the semi-conductor layer where the buried photodiode, the gate of the transfer transistor, the floating diffusion region and the gate of the reset transistor are not formed; and a driver transistor and a select transistor each formed on the well region and including highly doped impurity regions and lightly doped impurity diffusion regions, wherein a self-aligned silicide blocking layer is formed on the buried photodiode, the gate of the transfer transistor and the floating diffusion region while a self-aligned silicide layer is formed over gates of the driver transistor and the select transistor, the drain junction and the highly doped and lightly doped impurity regions of the well-region.

In accordance with a further aspect of the present invention, there is provided a method for fabricating a complementary metal-oxide-semiconductor (CMOS) image sensor, including: forming devices configuring a unit pixel and CMOS devices for processing data outputted from the unit pixel in a pixel region and a logic region of a semi-conductor layer, respectively; forming a self-aligned silicide blocking layer covering the pixel region and opening gate electrodes and source/drain regions of the logic region; forming a transition metal layer over the pixel region and the logic region; performing a rapid thermal annealing process, thereby forming a self-aligned silicide layer; and removing a non-reacted portion of the transition metal layer formed on the self-aligned silicide blocking layer.

In accordance with another further aspect of the present invention, there is provided a method for fabricating a complementary metal-oxide-semiconductor (CMOS) image sensor, including: forming devices configuring a unit pixel including a buried photodiode and a floating diffusion region and CMOS devices for processing data outputted from the unit pixel in a pixel region and a logic region of a semiconductor layer, respectively; forming a self-aligned silicide blocking layer over a region extending from the buried photodiode to the floating diffusion region; forming a transition metal layer over the pixel region and the logic region; performing a rapid thermal process, thereby forming a self-aligned silicide layer on the pixel and logic regions except for the region where the self-aligned silicide blocking layer is formed; and removing a non-reacted portion of the transition metal layer formed on the self-aligned silicide blocking layer.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

Hereinafter, a complementary metal-oxide-semiconductor image sensor and a method for fabricating the same in accordance with preferred embodiments of the present invention will be described in detail with reference to the accompanying drawings.

Figure 1:
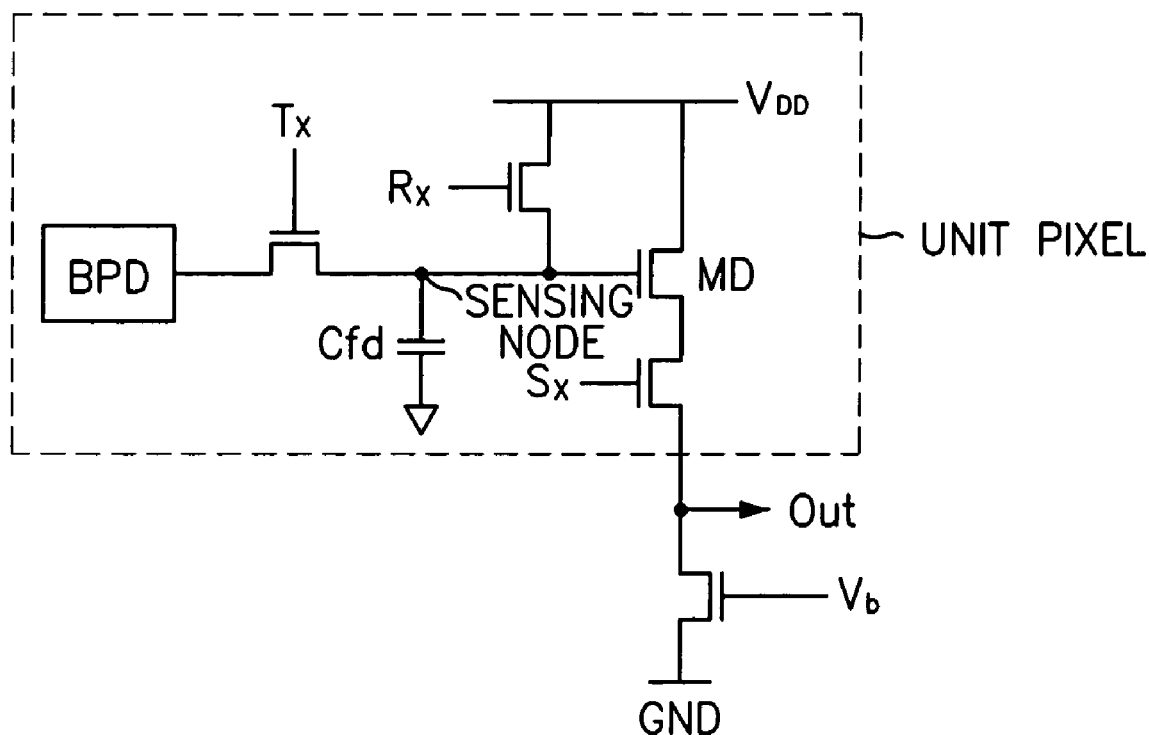
FIG. 1 is a circuit diagram showing a unit pixel of a conventional complementary metal-oxide-semiconductor (CMOS) image sensor.
Figure 2:
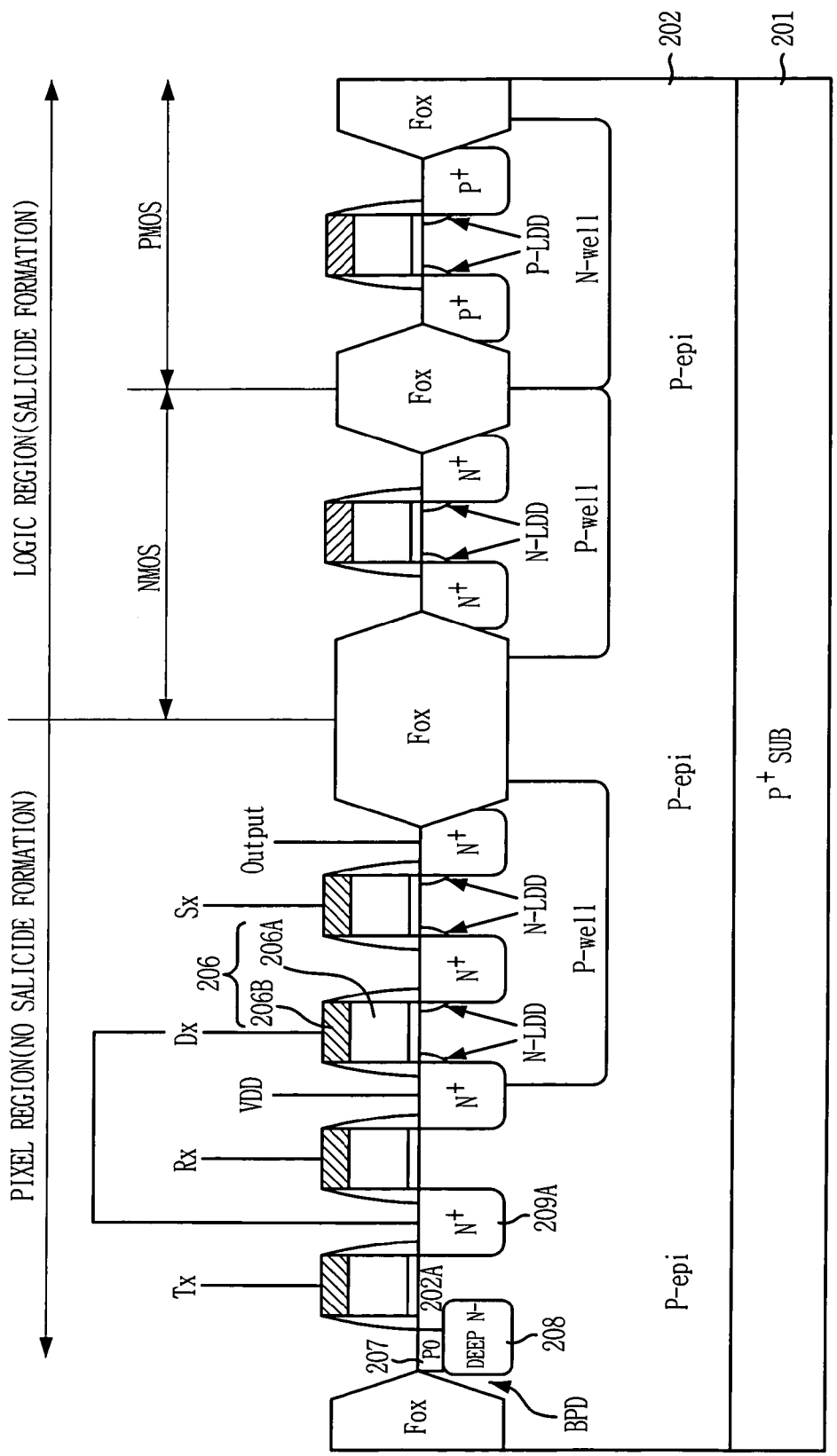
FIG. 2 is a diagram showing a structure of a unit pixel of a conventional CMOS image sensor.
Figure 3:
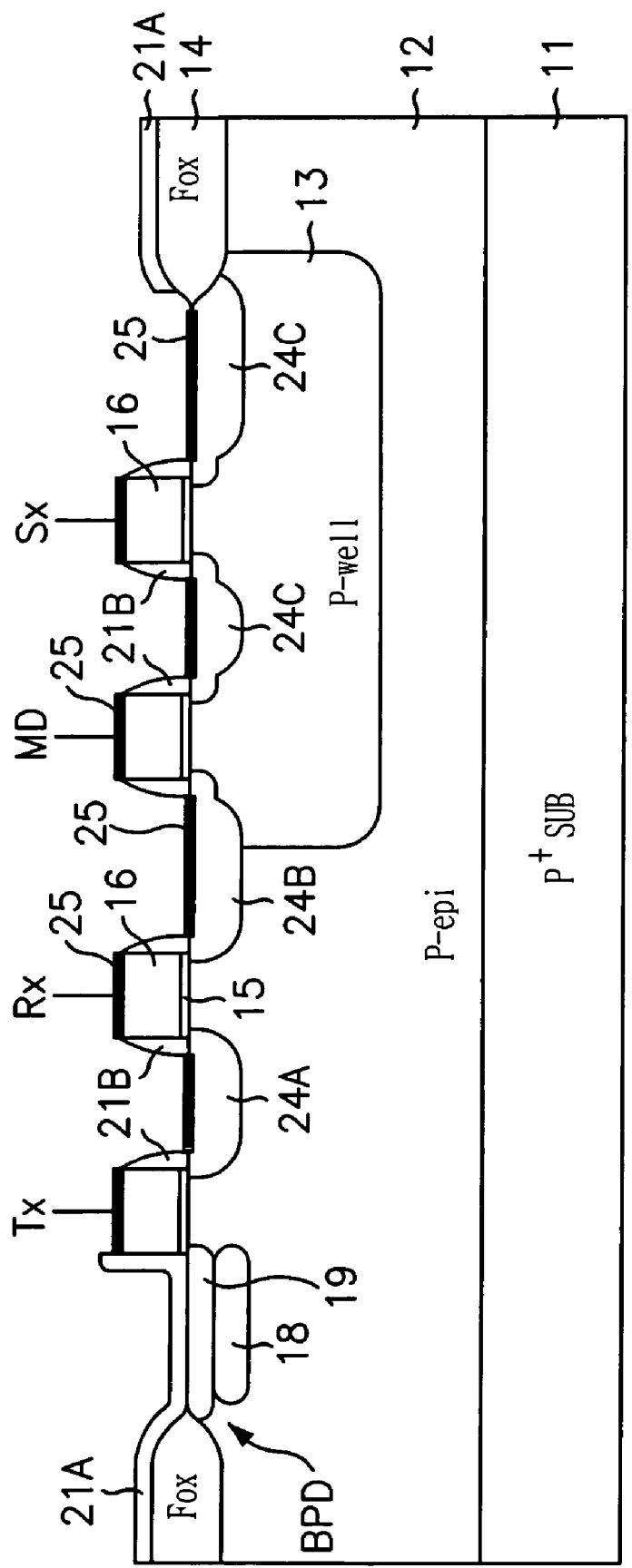
FIG. 3 is a cross-sectional view showing a structure of a unit pixel of another contrived conventional CMOS image sensor.
Figure 4:
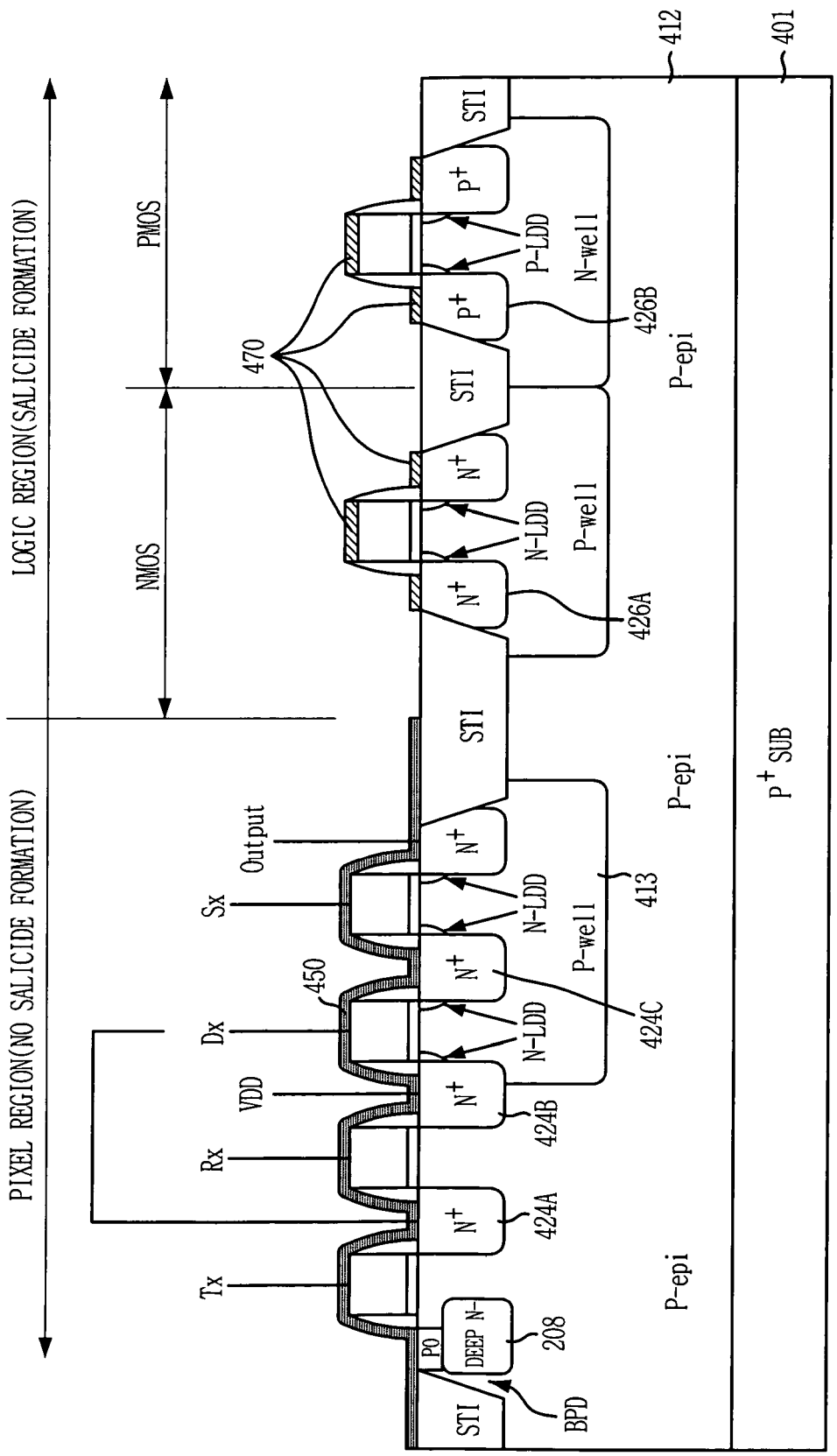
FIG. 4 is a cross-sectional view showing a structure of a CMOS image sensor in accordance with a first embodiment of the present invention.

FIG. 4 is a cross-sectional view showing a CMOS image sensor in accordance with a first embodiment of the present invention.

As shown, a salicide blocking layer 450 is formed on an entire pixel region including a buried photodiode BPD, an $N^+$-type floating diffusion region 424A, which is a sensing node, and other devices configuring a unit pixel. In a logic region, a salicide layer 470 is formed on each gate of CMOS devices and highly doped $N^+$-type impurity regions 426A and $P^+$-type impurity diffusion regions 426B both serving as source/drain regions. Herein, the salicide layer is a self-aligned silicide layer.

If the silicide layer is formed on the source/drain regions in the logic region except for the pixel region, an operation speed of the CMOS image sensor that detects an electric signal corresponding to a photo-generated electric charge through a correlated double sampling mode can be enhanced. Also, being different from the conventional CMOS image sensor, the silicide layer does not formed on the floating diffusion region, which is a sensing node. As a result, it is possible to suppress generation of leakage currents. Furthermore, unlike the conventional image sensor, the entire pixel region is shielded against a salicide process, and thus, reproducibility of a device fabrication process to which the design rule of an ultra fine line width of approximately 0.18 μm is applied can be improved.

Hereinafter, a structure of the CMOS image sensor in accordance with the first embodiment of the present invention will be described in detail.

As mentioned above, the CMOS image sensor includes a pixel region and a logic region. The unit pixel of the pixel region includes: a p-type epi layer 412 epitaxially grown on a substrate 401; a buried photodiode BPD for generating photo-electric charges by detecting light from outside, the buried photodiode BPD formed in the p-type epi layer 412; the $N^+$-type floating diffusion region 424A for storing the photo-electric charges generated from the buried photodiode BPD, the $N^+$-type floating diffusion region 424A formed beneath a portion of a surface of the p-type epi layer 412; a gate of a transfer transistor Tx formed on a portion of the p-type epi layer 412 disposed between the $N^+$-type floating diffusion region 424A and the buried photodiode BPD; an $N^+$-type drain junction 424B formed beneath another portion of the surface of the p-type epi layer 412; a gate of a reset transistor Rx formed on a portion of the p-type epi layer 412 disposed between the $N^+$-type floating diffusion region 424A and the $N^+$-type drain junction 424B; a p-well 413; $N^+$-type impurity diffusion regions 424C formed in the p-well 413; a driver transistor Dx having a gate (not shown) electrically connected with the $N^+$-type floating diffusion region 424A; and a select transistor Sx including the $N^+$-type impurity diffusion regions 424C formed in the p-well 413.

As mentioned above, the salicide blocking layer 450 is formed entirely over the pixel region. Since the buried photodiode BPD needs to receive light, the salicide blocking layer 450 is formed by using an oxide layer, which has an optical transparency characteristic, and serves a role in blocking the salicide layer from being formed in the pixel region. Although provided in the foregoing explanation, the salicide blocking layer 450 can be removed or remain after the salicide layer 470 is formed in the logic region.

In the logic region, there are CMOS devices including an N-channel metal-oxide-semiconductor (NMOS) transistor and a P-channel MOS (PMOS) transistor. The CMOS devices are devices for processing data outputted from the unit pixel. It should be noted that the salicide layer 470 is formed on gates of the NMOS transistor and the PMOS transistor and the highly doped $N^+$-type impurity diffusion regions 426A and the highly doped $P^+$-type impurity diffusion regions 426B.

A method for fabricating a CMOS image sensor constructed in the above structure will be described in detail.

First, the above described devices formed in the pixel region and the CMOS devices in the logic region for processing data outputted from the unit pixel are formed. Then, the salicide blocking layer 450 that covers the gates of the transfer transistor Tx, the reset transistor Rx, the drive transistor Dx and the select transistor Sx, the $N^+$-type floating diffusion region 424A, the $N^+$-type drain junction 424B and the $N^+$-type impurity diffusion regions 424C while opening the gates of the NMOS transistor and the PMOS transistor, the N⁺-type impurity diffusion regions 426A and the P⁺-type impurity diffusion regions 426B in the logic region is formed.

Next, a transition metal layer is formed on the above resulting structure and is subjected to a thermal process to form the self-aligned silicide layer 470. During the thermal process, the transition metal from the transition metal layer reacts with silicon from the gates and the N⁺-type and P⁺-type impurity diffusion regions 426A and 426B in the logic region to form the self-aligned silicide layer 470. Because of the salicide blocking layer 450, the self-aligned silicide layer 470 is not formed in the pixel region since the transition metal layer does not react with the salicide blocking layer 450 which does not include silicon. Afterwards, the transition metal layer that is not reacted as being formed on the salicide blocking layer 450 is removed.

In more detail of the salicide process, a titanium layer is formed on the above resulting substrate structure in a thickness ranging from approximately 300 Å to approximately 500 Å, and then, a first rapid thermal annealing process is performed on the titanium layer at a temperature ranging from approximately 700° C. to approximately 750° C. Because of this first rapid thermal annealing process, titanium from the titanium layer reacts with silicon from the gate electrodes made of polysilicon and the N⁺-type and P⁺-type impurity diffusion regions 426A and 426B, thereby obtaining the self-aligned silicide layer 450. Afterwards, a non-reacted portion of the titanium layer disposed on the salicide blocking layer 450 is removed by using an ammonium hydroxide (NH₄OH) containing solution. A second rapid thermal annealing process is performed at a temperature ranging from approximately 820° C. to approximately 870° C. to form a titanium silicide layer on the exposed gate electrodes and the N⁺-type and P⁺-type impurity diffusion regions 426A and 426B. Herein, in addition to the use of titanium, other transition metals such as cobalt can be used as well. Since a next applied process is an inter-layer insulation process, the salicide blocking layer 450 may not be removed.

Figure 5:
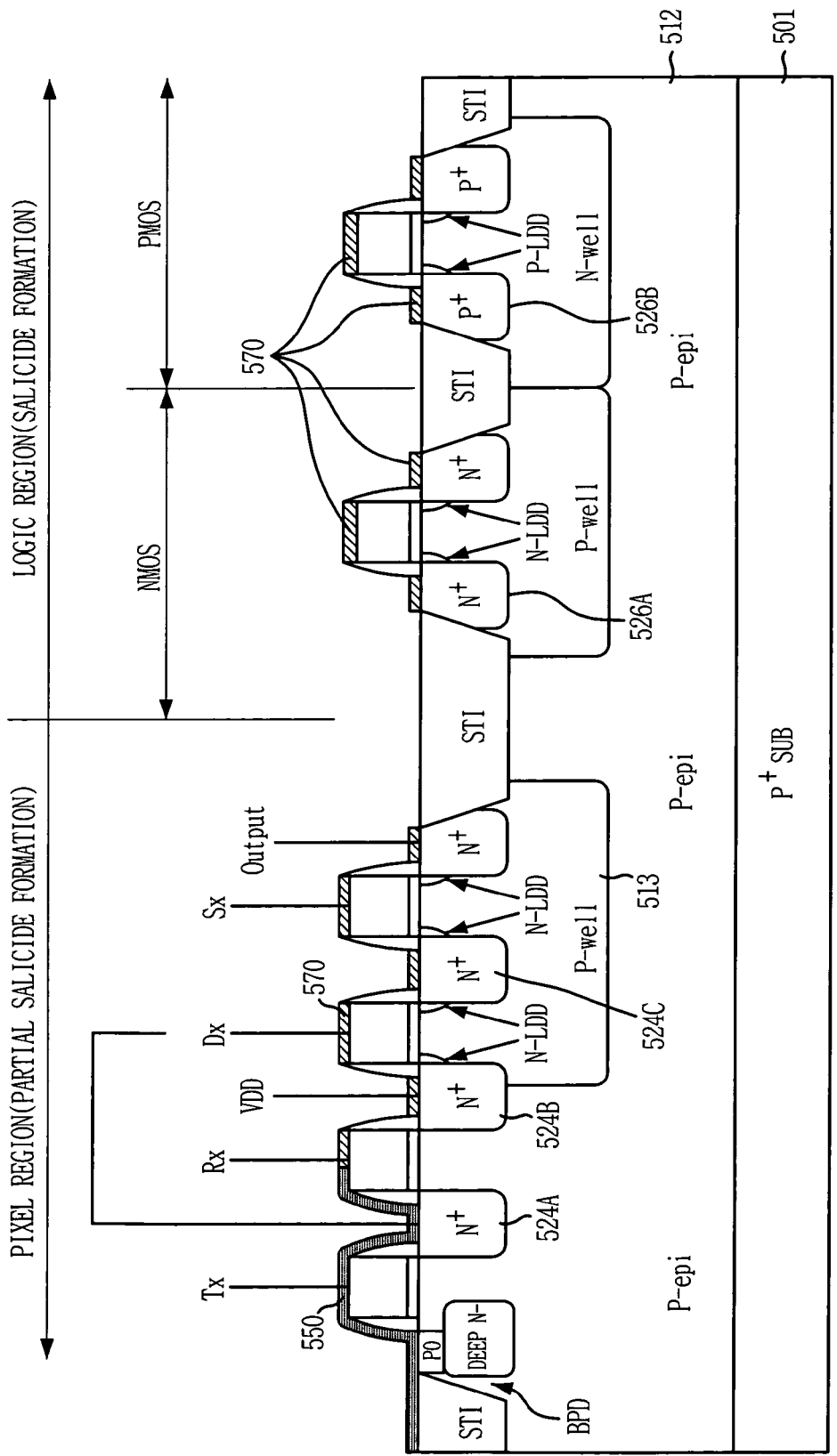
FIG. 5 is a cross-sectional view showing a structure of a CMOS image sensor in accordance with a second embodiment of the present invention.

FIG. 5 is a cross-sectional view showing a CMOS image sensor in accordance with a second embodiment of the present invention.

In the CMOS image sensor according to the second embodiment of the present invention, a salicide blocking layer 550 is formed on a buried photodiode (BPD), a gate of a transfer transistor Tx, an N⁺-type floating diffusion region 524A and a portion of a gate of a reset transistor Rx, while a salicide layer 570 is formed over those devices configuring a unit pixel in a pixel region and over CMOS devices in a logic region. That is, the salicide layer 570 is formed on gates of a driver transistor Dx, a select transistor Sx, an NMOS transistor, a PMOS transistor, an N⁺-type drain junction 524B, N⁺-type impurity diffusion regions 524C and N⁺-type and P⁺-type impurity diffusion regions 526A and 526B. It should be noted that a CMOS image sensor fabrication method according to the second embodiment is identical to the CMOS image sensor fabrication method described in the first embodiment of the present invention with the exception of the location where the salicide blocking layer 550 is formed. Thus, a detailed description of the CMOS image sensor method according to the second embodiment will be omitted.

Especially, the illustrated structure of the CMOS image sensor in FIG. 5 provides advantages in addition to the described advantages obtained when applying the first embodiment. In more detail of the additional advantages, it is possible to maintain accurate sensing capability by decreasing contact resistance of the gate of each driver transistor Dx, which serves a role in sensing signals by being disposed within several hundred thousands to several millions of pixels. Also, it is possible to suppress an incidence of a timing delay with respect to the select transistors Sx, and as a result of this advantage, a high quality of images and high operation speed can be obtained. Also, because the salicide layer does not exist at the floating diffusion region, which is the sensing node, leakage current is not generated. In addition, it is possible to improve reproducibility of a CMOS process to which the design rule of 0.18 µm ultra fine line width is applied.

While the present invention has been described with respect to certain preferred embodiments, it will be apparent to those skilled in the art that various changes and modifications may be made without departing from the spirit and scope of the invention as defined in the following claims.

What is claimed is:

1. A complementary metal-oxide-semiconductor (CMOS) image sensor, comprising:
   a pixel region including a plurality of unit pixels, each including a buried photodiode and a floating diffusion region; and
   a logic region including CMOS devices for processing data outputted from the unit pixels,
   wherein a self-aligned silicide layer is formed on gate electrodes and source/drain regions of the CMOS devices in the logic region and a self-aligned silicide blocking layer is formed over the entire pixel region.

2. The CMOS image sensor of claim 1, wherein the self-aligned silicide blocking layer is a transparent oxide layer.

* * * * *